United States Patent
Persson et al.

(10) Patent No.: US 9,559,601 B2
(45) Date of Patent: Jan. 31, 2017

(54) FORWARD-FLYBACK TOPOLOGY SWITCHED MODE POWER SUPPLY

(71) Applicant: Telefonaktiebolaget L M Ericsson (publ), Stockholm (SE)

(72) Inventors: Oscar Persson, Kalmar (SE); Mikael Appelberg, Göteborg (SE); Magnus Karlsson, Oskarshamn (SE)

(73) Assignee: Telefonaktiebolaget LM Ericsson (publ), Stockholm (SE)

(*) Notice: Subject to any disclaimer, the term of this patent is extended or adjusted under 35 U.S.C. 154(b) by 211 days.

(21) Appl. No.: 14/235,931

(22) PCT Filed: Feb. 28, 2013

(86) PCT No.: PCT/EP2013/054051
§ 371 (c)(1),
(2) Date: Jan. 29, 2014

(87) PCT Pub. No.: WO2014/131455
PCT Pub. Date: Sep. 4, 2014

(65) Prior Publication Data
US 2015/0333640 A1 Nov. 19, 2015

(51) Int. Cl.
*H02M 3/335* (2006.01)
(52) U.S. Cl.
CPC ..... *H02M 3/33546* (2013.01); *H02M 3/33538* (2013.01); *H02M 3/33592* (2013.01); *Y02B 70/1475* (2013.01)
(58) Field of Classification Search
CPC .............. H02M 3/33523; H02M 3/33553; H02M 3/33576; H02M 3/33592; H02M 3/33546; H02M 3/3353; H02M 3/33538
(Continued)

(56) References Cited

U.S. PATENT DOCUMENTS

| 5,434,768 A | * | 7/1995 | Jitaru | H02M 3/33569 363/131 |
| 6,064,580 A | * | 5/2000 | Watanabe | H02M 3/33592 363/127 |

(Continued)

OTHER PUBLICATIONS

Agarwal, V. et al., "A Smart Power Converter Module for Buck Applications Operating at High Input Power Factor", Proceedings of the 28th Annual Conference of the IEEE Industrial Electronics Society, Nov. 5-8, 2002, pp. 1202-1207, vol. 2, Sevilla, Spain.

(Continued)

*Primary Examiner* — Timothy J Dole
*Assistant Examiner* — Sisay G Tiku
(74) *Attorney, Agent, or Firm* — Coats & Bennett, P.L.L.C.

(57) ABSTRACT

A switched mode power supply (400), comprising a transformer (410) having a primary winding (410-1), a transformer core (410-3) configured to store energy transferred thereto from the primary winding (410-1) during operation, and a secondary winding (410-2) having a first terminal (T1) and a second terminal (T2). The switched mode power supply also has a primary side circuit (Q1, Q2, C1) arranged to generate voltage pulses and thereby to drive the primary winding (410-1) of the transformer (410), and a secondary side circuit comprising a rectification circuit connected to the secondary winding (410-2) at the first and second terminals (T1, T2). The rectification circuit is arranged such that during a forward phase of operation of the switched mode power supply, in which the primary winding (410-1) is driven by the primary side circuit to magnetize, and store energy in, the transformer core (410-3), a current induced to flow in the secondary winding (410-2) from the second terminal (T2) to the first terminal (T1) is output by the rectification circuit. The rectification circuit is further arranged such that during a fly-back phase of operation of (Continued)

the switched mode power supply, in which the magnetization of the transformer core (410-3) is reset, a current induced to flow in the secondary winding from the first terminal (T1) to the second terminal (T2) of the secondary winding (410-2) is output by the rectification circuit so that energy stored in the transformer (410) during the forward phase of operation is output by the rectification circuit.

8 Claims, 11 Drawing Sheets

(58) Field of Classification Search
USPC .................. 363/21.04–21.08, 21.12–21.18
See application file for complete search history.

(56) References Cited

U.S. PATENT DOCUMENTS

| | | | | |
|---|---|---|---|---|
| 6,246,592 | B1* | 6/2001 | Balogh | H02M 3/33592 363/16 |
| 6,377,477 | B1* | 4/2002 | Xie | H02M 3/33592 363/20 |
| 6,628,532 | B1* | 9/2003 | Rinne | H02M 3/33592 363/127 |
| 7,924,579 | B2 | 4/2011 | Arduini | |
| 8,009,448 | B2 | 8/2011 | Liu | |
| 8,456,867 | B1* | 6/2013 | Karlsson | H02M 1/36 323/901 |
| 8,830,701 | B2* | 9/2014 | Takegami | H02P 27/06 320/166 |
| 9,019,724 | B2* | 4/2015 | Telefus | H02M 3/33523 363/21.01 |
| 9,124,190 | B2* | 9/2015 | Karlsson | H02M 3/335 |
| 2002/0131282 | A1 | 9/2002 | Takegami | |
| 2002/0167821 | A1* | 11/2002 | Xing | H02M 3/33592 363/21.11 |
| 2004/0022075 | A1* | 2/2004 | Perry | H02M 3/33592 363/21.01 |
| 2004/0037100 | A1* | 2/2004 | Orr | H02M 3/33576 363/131 |
| 2004/0136208 | A1 | 7/2004 | Agarwal et al. | |
| 2005/0174811 | A1* | 8/2005 | Liu | H02M 1/34 363/21.01 |
| 2010/0067259 | A1* | 3/2010 | Liu | H02M 3/33569 363/21.01 |
| 2011/0037319 | A1* | 2/2011 | Matsui | H02M 3/33584 307/43 |
| 2012/0147629 | A1* | 6/2012 | Mao | H02M 3/28 363/17 |
| 2013/0135903 | A1* | 5/2013 | Fu | H02M 3/3374 363/17 |
| 2014/0198536 | A1* | 7/2014 | Fu | H02M 3/33546 363/17 |

OTHER PUBLICATIONS

Ericsson, "PKU 5000E series DC/DC converters, input 18-72 V, Output up to 10 A/35 W", Technical Specification, May 1, 2009, pp. 1-25, EN/LZT 146 391 R4B, Ericsson AB.

* cited by examiner

FORWARD-FLYBACK TOPOLOGY SWITCHED MODE POWER SUPPLY

TECHNICAL FIELD

The present invention generally relates to the field of switched mode power supplies (sometimes referred to as switch mode power supplies or switching mode power supplies) and more specifically to switched mode power supplies of the forward-flyback circuit topology.

BACKGROUND

The switched mode power supply (SMPS) is a well-known type of power converter having a diverse range of applications by virtue of its small size and weight and high efficiency, for example in personal computers and portable electronic devices such as cell phones. A SMPS achieves these advantages by switching one or more switching elements such as power MOSFETs at a high frequency (usually tens to hundreds of kHz), with the frequency or duty cycle of the switching being adjusted using a feedback signal to convert an input voltage to a desired output voltage. A SMPS may take the form of a rectifier (AC/DC converter), a DC/DC converter, a frequency changer (AC/AC) or an inverter (DC/AC).

There are a number of different circuit topologies for switched mode power supplies, and each has its benefits and shortcomings. Among these are the so-called "fly-back" and "forward" topologies, which are widely used for many different SMPS applications. Fly-back converters are simple, low cost isolated converters that are commonly used for low output power applications. Forward converters, on the other hand, are generally used where greater efficiency and power output are required. The principles of operation of typical fly-back and forward converter circuits will now be explained with reference to FIGS. 1A, 1B, 2A and 2B.

FIG. 1A illustrates a typical fly-back converter with an active clamp on the primary side. More specifically, the fly-back converter 100 comprises a fly-back transformer 110 having a primary winding 110-1 and a secondary side winding 110-2 that are wound around the transformer core 110-3 in a turns ratio $N=n_p/n_s$, where $n_p$ and $n_s$ are the numbers of turns in the primary winding 110-1 and secondary winding 110-2, respectively. The transformer core 110-3 has a gap (e.g. an air gap) for storing magnetisation energy provided by the primary winding 110-1 during operation.

The primary winding 110-1 is connected to an input voltage source by a primary side circuit comprising a capacitor C1 and actively controlled switches Q1 and Q2. Each of Q1 and Q2 may, as in the present example, be provided in the form of a transistor such as a metal-oxide-semiconductor field-effect transistor (MOSFET) or a bipolar junction transistor (BJT). The secondary side circuit of the fly-back converter 100 comprises a rectifier in the form of diode D2 and a capacitor C2, which are connected as shown in FIG. 1A to rectify and filter the secondary winding voltage.

The fly-back converter 100 can be understood to operate by alternating between two "phases" or "modes" of operation (relating to respective portions of the SMPS switching cycle), as will now be explained.

During the first phase of steady state operation, transistor Q1 is turned ON and transistor Q2 is turned OFF (as shown in traces (a) and (b) in FIG. 1B), so that current from the input voltage source flows through Q1 and the primary winding 110-1 (trace (c)) to magnetise the core 110-3 of the fly-back transformer 110 and store energy in the magnetic field. During the first phase of operation, although current flow through the secondary winding 110-2 is blocked because diode D2 is reverse-biased, current is still supplied to the load of the fly-back converter by the (partial) discharging of capacitor C2, as shown in trace (d) in FIG. 1B.

During the second phase of operation, transistor Q1 is turned OFF and transistor Q2 is turned ON, and the active clamp circuit comprising Q2 and C1 resets the magnetisation of the transformer core 110-3. Meanwhile, on the secondary side, diode D2 becomes forward-biased (since the voltage polarities across the windings have reversed) so that the energy stored in the magnetic field of the transformer 110 during the first phase of operation is released into the secondary side circuit to provide a current to the load and charge the capacitor C2.

As mentioned above, the "forward" topology is also widely used in switching converters, and an example of a forward converter will now be described with reference to FIGS. 2A and 2B. The primary side circuit of the forward converter 200 shown in FIG. 2A is the same as that of the fly-back converter 100 of FIG. 1A, and its description will therefore not be repeated. Furthermore, the transformer 210 of the forward converter 200 is substantially the same as the fly-back transformer 110 but may differ in not having a gap in the transformer core for storing energy. The principal differences between forward converter 200 and the fly-back converter 100 thus lie in the configuration of the secondary side circuit; the secondary side circuit of the forward converter 200 comprises diodes D1 and D2 that are connected to the secondary winding 210-2 and to an inductor (or "choke") L1 as shown in FIG. 2A, and a capacitor C2. The forward converter 200 can also be understood to operate by alternating between two phases/modes of operation, as follows.

During the first phase of steady state operation, transistor Q1 is turned ON and transistor Q2 is turned OFF (as shown in traces (a) and (b) in FIG. 2B), so that current from the input voltage source flows through Q1 and the primary winding 210-1 (trace (c)) to induce a voltage (scaled by the turns ratio N) and simultaneous current flow in the secondary winding 210-2. The induced voltage causes diode D1 to become forward-biased such that current is allowed to pass from the secondary winding 210-2 to the converter output via the diode D1 and inductor L1 (trace (d) in FIG. 2B), thereby transferring energy from the primary side to the secondary side of the transformer 210. A part of the transferred energy is stored in the magnetic field of inductor L1. Diode D2 remains reverse-biased during the first phase and does not conduct.

During the second phase of operation, when transistor Q1 is turned OFF, current through the filter inductor L1 continues without abrupt change because diode D2, which is forward-biased by the EMF from inductor L1, provides a free-wheeling path for this current (trace (e) in FIG. 2B). Energy stored in inductor L1 during the first phase of operation will thus be released to capacitor C2.

Although converter circuits of the "fly-back" and "forward" topology are widely used, each topology has certain limitations that are hard to resolve.

For example, the fly-back converter does not need a dedicated choke to smooth the output current. Another advantage of a fly-back converter is that it can boost the voltage; if the duty cycle is greater that 50%, the output will be higher than the turns ratio N of the transformer allows. Normally, a fly-back converter operates with a duty cycle just below 50% for maximum efficiency. Operating with a duty cycle above 50% also requires slope-compensation for stability. In other words, in many applications, the fly-back circuit has to be designed outside the "sweet spot".

Furthermore, although the fly-back converter 100 does not require an output choke, it has the drawback of requiring a relatively large transformer core. In fly-back converters, the gapped transformer inductance results in a zero in the right-half-plane (RHP), which often makes closed-loop compensation in continuous conduction mode (CCM) difficult. Typically, the closed-loop bandwidth in CCM is very narrow and the resulting transient response is very slow. Another drawback of fly-back converters is the requirement of a large output capacitor due to the lack of a second-order low-pass inductor/capacitor filter at the output.

In the forward converter 200, since primary side transistor Q1 can be ON for up to nearly 100% of the time, utilisation of switch components is better than in the fly-back circuit 100 of FIG. 1A; at minimum input voltage (e.g. 36 V), the forward converter 200 operates at almost 100% duty cycle and the primary side transistor Q1 is fully utilised. However, this comes at the expense of needing to provide the forward converter with a choke L1, although the requirements for the output capacitor C2 are reduced. In addition, to avoid transformer saturation, the forward converter 200 requires a magnetisation resetting circuit. All of these increase the component count and manufacturing cost.

In some applications, one of the two topologies described above will clearly be the best choice, while in other applications there is little to choose between them. However, there are also applications where totally different operating conditions are encountered. For instance, the converter may be required to operate in 24 V systems as well as in 48 V systems. Under such circumstances, a converter topology capable of handling a wider input voltage range would be required.

This requirement can be met by the so-called "forward-flyback" (or "fly-forward") topology, which may be more attractive for handling a wider input voltage range (e.g. 18-72 V) than is normally required (e.g. 36-75 V). A fly-forward circuit topology is employed in Ericsson's PKU 5000E series of DC/DC converters, and will now be described with reference to FIGS. 3A and 3B.

FIG. 3A shows an example of a fly-forward converter 300, which has a primary side circuit that is the same as in the fly-back converter 100 and forward converter 200. However, the transformer 310 of the fly-forward converter 300 has, in addition to a gapped core 310-3, two secondary side windings comprising a first winding 310-2a and a second winding 310-2b, each having the same number of turns as the secondary side winding of the transformers 110 and 210. The secondary side of transformer 310 thus effectively has a larger, centre-tapped secondary winding, which enables the fly-forward converter 300 to swap seamlessly between fly-back to forward modes of operation or to co-operate between them.

More specifically, the fly-forward converter 300 has an output choke L1 connecting the centre-tap terminal of the transformer 310 to the converter's output terminal +OUT. The remaining terminals of the secondary coil are each connected to output terminal −OUT by transistors Q3 and Q4 (although diodes with appropriately arranged polarities could alternatively be used instead of these transistors). The fly-forward converter 300 thus uses more windings on the secondary side than the fly-back and forward converter types since its two transformer windings are connected in series. Transistors Q3 and Q4 must withstand double the voltage that is applied to inductor L1.

During the first phase of steady state operation, transistor Q1 is turned ON and transistor Q2 is turned OFF (as shown in traces (a) and (b) in FIG. 3B) so that current from the input voltage source flows through Q1 and the primary winding 310-1 (trace (c)) to induce a voltage (scaled by the turns ratio N) and simultaneous current flow through transistor Q3 and secondary winding 310-2a. Meanwhile, the core 310-3 is magnetised and stores in the magnetic field some of the energy transferred from the primary side. The voltage induced across winding 310-2a causes current flow from the secondary winding 310-2a to the converter output via the inductor L1 (trace (d) in FIG. 3B), thereby transferring energy from the primary side to the secondary side of the transformer 310. Part of the transferred energy is stored in the magnetic field of L1.

During the second phase of operation, transistor Q1 is turned OFF and transistor Q2 is turned ON, and the active clamp circuit resets the magnetisation of the transformer core 310-3. Meanwhile, on the secondary side, transistor Q4 is turned ON so that the fly-back energy stored in the magnetic field of the transformer 310 during the first phase of operation is released into the secondary side circuit to provide a current to the converter's load and charge capacitor C2.

The fly-forward converter 300 has several advantages over the fly-back and forward converters shown in FIGS. 1 and 2. For example, it can operate with a smaller output capacitance than the fly-back converter 100, and requires no output choke (although an output choke may optionally be included, as in the example of FIG. 3A). Furthermore, there is no RHP zero, so that the converter is easy to compensate and has a fast transient response. In addition, no resetting circuitry is needed, although it may nevertheless be provided, as in the example of FIG. 3A.

These advantages make the fly-forward topology an attractive design choice, particularly for switched mode power supplies that are required to operate over a relatively wide input voltage range.

SUMMARY

Despite efforts over the years to increase the efficiency of fly-forward converters, there still remains room for improvement.

In the past, SMPS designers have tended to approach the problem of increasing fly-forward SMPS efficiency by appropriately selecting the type and design of switching devices, and adjusting the way in which they are operated, in order to minimise switching losses. While these efforts have led to significant efficiency gains, the basic configuration of SMPS transformers has attracted little attention and has therefore remained largely unchanged over the years.

Realising that transformer losses can account for a sizable proportion of the overall losses in the modern fly-forward SMPS, the present inventors have considered whether the transformer used in such an SMPS can be reconfigured to function more efficiently. In doing so, the inventors have conceived an SMPS comprising a transformer with a single secondary side winding (as defined between two adjacent connection terminals for connecting the intervening coil to external circuitry) for transferring power from the primary side circuit to the secondary side circuit and hence to output terminals of the SMPS, the secondary side winding serving to conduct current on the secondary side during the entire switching cycle of the SMPS.

More specifically, the inventors have conceived an SMPS comprising a transformer having a primary winding, a transformer core configured to store energy transferred thereto from the primary winding during operation, and a secondary winding having a first terminal and a second terminal. The SMPS further comprises a primary side circuit arranged to generate voltage pulses and thereby to drive the primary winding of the transformer, and a secondary side circuit comprising a rectification circuit connected to the secondary winding at the first and second terminals. The rectification circuit is arranged such that, during a forward phase of operation of the switched mode power supply, in which the primary winding is driven by the primary side circuit to magnetise, and store energy in, the transformer core, a current induced to flow in the secondary winding from the second terminal to the first terminal is output by the rectification circuit. The rectification circuit is further arranged such that, during a fly-back phase of operation of the switched mode power supply, in which the magnetisation of the transformer core is reset, a current induced to flow in the secondary winding from the first terminal to the second terminal of the secondary winding is output by the rectification circuit so that energy stored in the transformer during the forward phase of operation is output by the rectification circuit.

Thus, in an embodiment, a single secondary winding is used to provide a common current path for the secondary-side current in both the forward and fly-back phases of operation, thereby significantly reducing the number of winding turns that are required on the secondary side of the transformer to give a required voltage conversion ratio. This may allow resistive losses to be reduced up to 75%, the operating voltage in the transformer to be reduced to one half of the value in the background example of FIG. 3A, as well as a reduction in the capacitive coupling losses. The advantages are therefore considerable.

In an embodiment, the rectification circuit may comprise: a first rectifier and a second rectifier connected to the first and second terminals of the secondary winding, respectively, the first and second rectifiers being further connected to a first output terminal of the SMPS; and a third rectifier and a fourth rectifier connected to the first and second terminals of the secondary winding, respectively, the third and fourth rectifiers being further connected to a second output terminal of the SMPS. In this embodiment, the polarities of the rectifiers are arranged such that, during the forward phase of operation of the SMPS, the current induced to flow in the secondary winding from the second terminal to the first terminal is output by the rectification circuit and, during the fly-back phase of operation of the SMPS, the current induced to flow in the secondary winding from the first terminal to the second terminal of the secondary winding is output by the rectification circuit.

Since some voltage classes of rectifier are significantly better than others in terms of efficiency, the use of a four-element rectification circuit having rectifiers of a lower voltage rating, which is made possible by the rectification circuit of this embodiment, may allow losses in the secondary side of the SMPS to be further reduced in relation to the background example of FIG. 3A, where a two-element rectification circuit, with rectifiers of higher voltage rating, is employed.

BRIEF DESCRIPTION OF THE DRAWINGS

Embodiments of the invention will now be explained in detail, by way of example only, with reference to the accompanying figures, in which.

DETAILED DESCRIPTION OF EMBODIMENTS

Embodiment 1

Figure 4A:
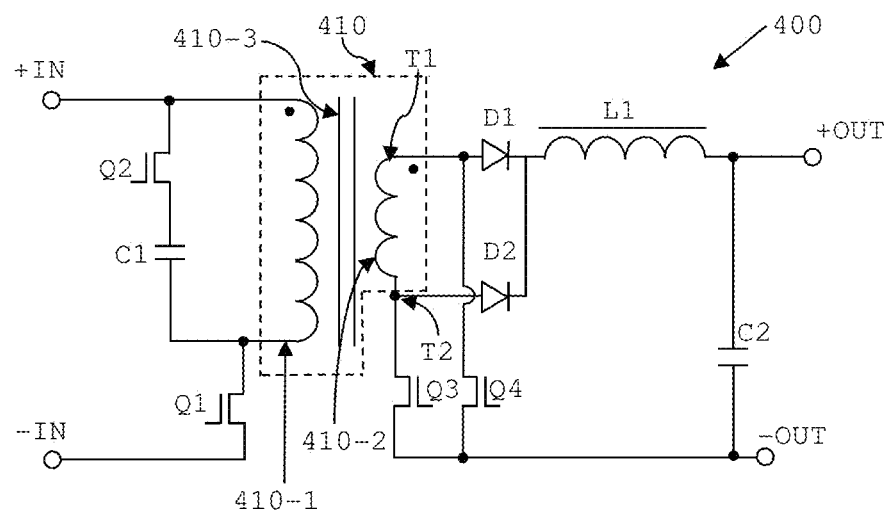
FIG. 4A shows the circuit layout of an SMPS according to a first embodiment of the invention.

FIG. 4A shows a switched mode power supply according to a first embodiment of the present invention. The SMPS 400 shown in FIG. 4A has a forward-flyback topology converter circuit with an active clamp on the primary side. The SMPS of the present embodiment may be used for radio frequency power amplifier (RFPA) applications to deliver output voltages of 10-32 V or 17-32 V, for example.

More specifically, the fly-back converter 400 comprises a fly-back transformer 410 having a primary winding 410-1 and a secondary side winding 410-2 that are wound around a transformer core 410-3 in a turns ratio $N=n_p/n_s$ where $n_p$ and $n_s$ are the numbers of turns in the primary winding 410-1 and secondary winding 410-2, respectively. The transformer core 410-3 may be formed of any suitable material(s) (including e.g. powdered iron or other material having high magnetic permeability) and may be shaped such that the transformer 110-3 has a gap (e.g. an air gap) for storing magnetisation energy provided by the primary winding 110-1 during operation.

The primary winding 410-1 is connected to an input voltage source by a primary side circuit comprising a capacitor C1 and actively controlled switches Q1 and Q2. Each of Q1 and Q2 may, as in the present embodiment, be provided in the form of a transistor that is capable of operating at the required switching frequency, such as a MOSFET or a BJT. The primary side circuit is configured to generate voltage pulses and drive with these pulses the primary winding 410-1 of the transformer 410. To drive the primary side winding 410-1 in a pulsed manner, transistors Q1 and Q2 may switch ON and OFF in accordance with a predetermined (fixed) duty cycle pulses or they may, as in the present embodiment, be controlled by a pulse width modulation (PWM) controller (not shown in FIG. 4A), on the basis of a feedback signal indicative of the output voltage of the converter, if regulation of the output voltage is required.

Figure 1A:
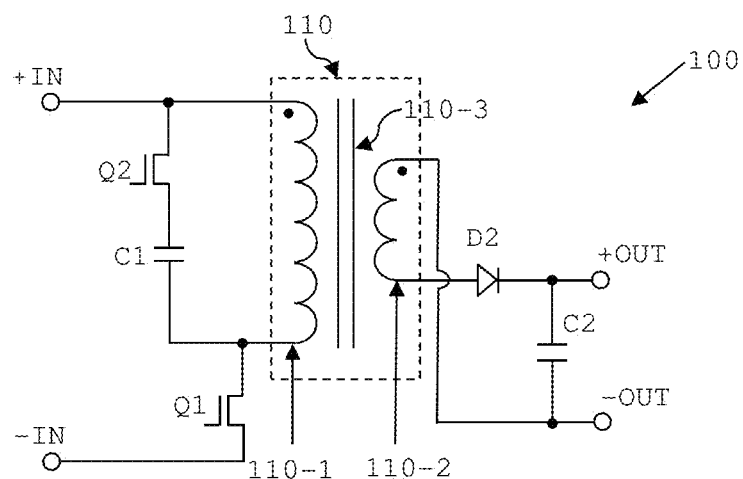
FIG. 1A shows the circuit layout of a conventional fly-back converter.
Figure 1B:
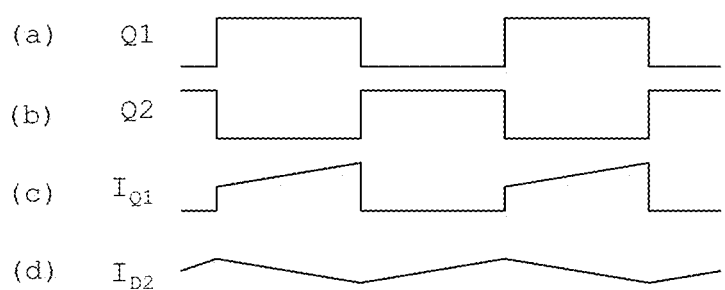
FIG. 1B shows timing diagrams illustrating the operation of switches and current flows in the circuit of FIG. 1A during operation.
Figure 2A:
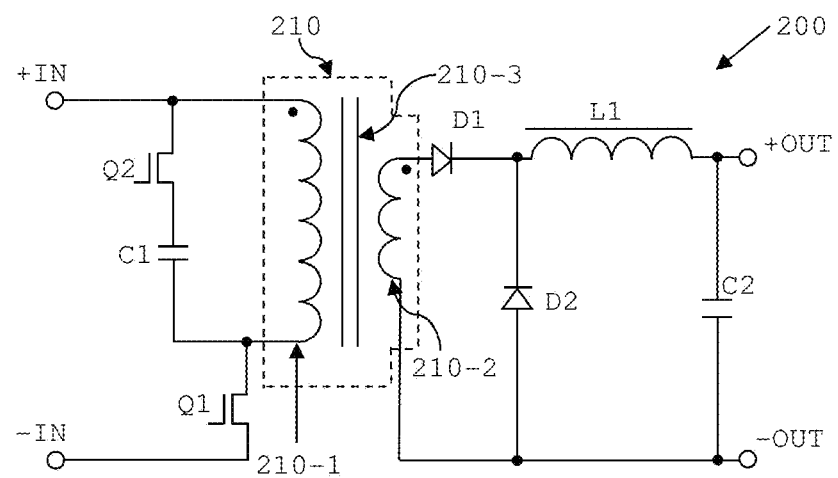
FIG. 2A shows the circuit layout of a conventional forward converter.
Figure 2B:
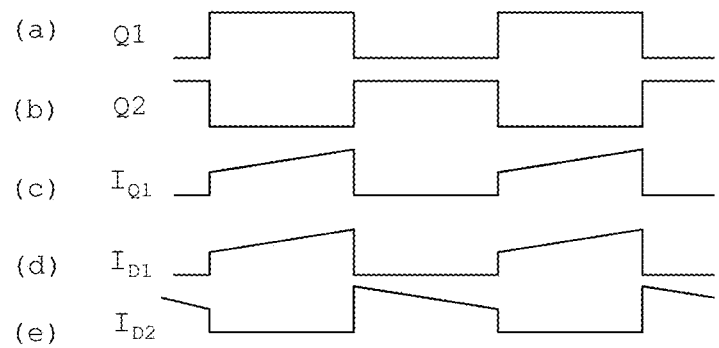
FIG. 2B shows timing diagrams illustrating the operation of switches and current flows in the circuit of FIG. 2A during operation.
Figure 3A:
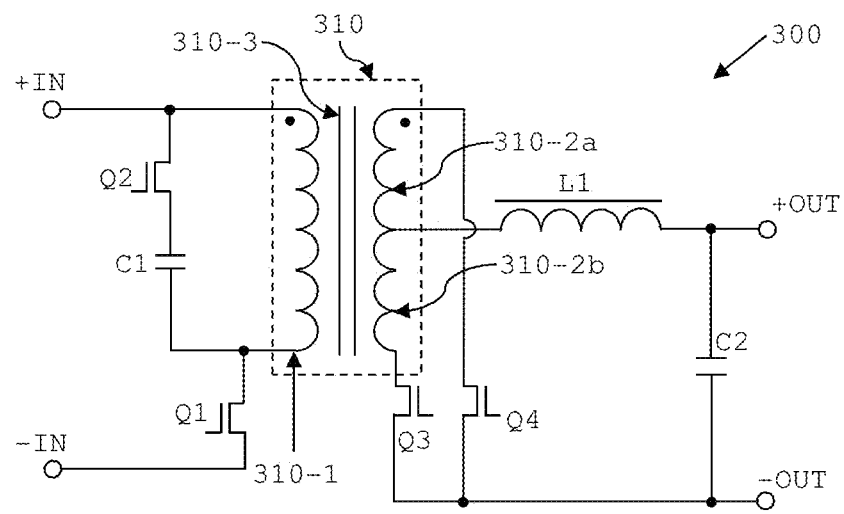
FIG. 3A shows the circuit layout of a known forward-flyback converter.

The secondary side of the transformer 410 differs from that of the conventional circuit of FIG. 3A by having a single secondary coil/winding 410-2 that has only two connection terminals, T1 and T2, for transferring power to load of the SMPS 400 via the rectification circuit of the SMPS 400. In other words, in contrast to secondary winding 310-2 shown in FIG. 3A, the secondary winding 410-2 of the present embodiment has no centre-tap terminal connected to the rectification circuit that is provided on the secondary side. Terminals T1 and T2 may, as in the present embodiment, correspond to respective ends of the secondary coil 410-2, or one of or both of T1 and T2 may instead correspond to electrical connection points to respective portions (e.g. a respective single loop) of the secondary coil 410-2.

The rectification circuit is arranged such that, during a first ("forward") phase of operation of the SMPS 400, in which the primary winding 410-1 is driven by the primary side circuit to magnetise (and store energy in) the transformer core 410-3, a current induced to flow along the secondary winding 410-2 in a first direction (e.g. from terminal T2 to terminal T1) is output by the rectification circuit and, during a second ("fly-back") phase of operation of the SMPS 400, in which the magnetisation of the transformer core 410-3 is substantially reset, a current induced to flow along the same current path through secondary winding 410-2 as during the forward phase, in the opposite direction to the first direction (in this example, from terminal T1 to terminal T2) is output by the rectification circuit so that energy stored in the transformer 410 during the forward phase of operation is output by the rectification circuit.

In the present embodiment, the rectification circuit takes the exemplary form of a semi-synchronous full-wave rectifier, as shown in FIG. 4A. More specifically, the rectification circuit comprises a first and a second rectifier that are directly connected to the first terminal T1 and second terminal T2 of the secondary winding 410-2, respectively, and also to output terminal –OUT of the SMPS 400. In the present embodiment, each of these rectifiers is a synchronous rectifier; in other words, an active switching device such as a transistor (e.g. a MOSFET or a BJT) that can be controlled in accordance with control signals to switch between a conductive state and a non-conductive state so as to provide a rectifying function. Thus, synchronous rectifiers Q3 and Q4 are directly connected to terminals T2 and T1 of the secondary winding 410-2, respectively, and both Q3 and Q4 are directly connected to output terminal –OUT of the SMPS 400.

The rectification circuit of the first embodiment further comprises a third rectifier in the exemplary form of a diode D1, and a fourth rectifier in the exemplary form of a diode D2, that are directly connected (via their respective anodes) to the terminals T1 and T2 of the secondary winding 410-2, respectively. Providing the high-side rectifiers in the form of diodes D1 and D2 provides the advantages of simplicity and low cost, as they may eliminate the need for reverse current protection circuits under certain conditions. Diodes may also perform better than some other rectifiers (such as MOSFETs) at high SMPS load levels.

The secondary side circuit may, as in the present embodiment, further comprise an output LC filter having an inductor L1 and output capacitor C2. In this case, the cathodes of the high-side rectifiers D1 and D2 may be connected to a common end of the inductor L1, with the remaining end of the inductor L1 being connected to output terminal +OUT of the SMPS 400, as also shown in FIG. 4A. In other words, the cathodes of D1 and D2 are connected to the +OUT terminal via the inductor L1.

More generally, regardless of the specific form they take, the four rectifiers that are arranged in the rectification circuit as set out above should also have their polarities arranged such that, during the forward phase of operation, the current induced to flow in the secondary winding 410-2 from e.g. the second terminal T2 to the first terminal T1 is output by the rectification circuit and, during the fly-back phase of operation, the current induced to flow in the secondary winding from the first terminal T1 to the second terminal T2 of the secondary winding 410-2 is output by the rectification circuit.

Figure 4B:
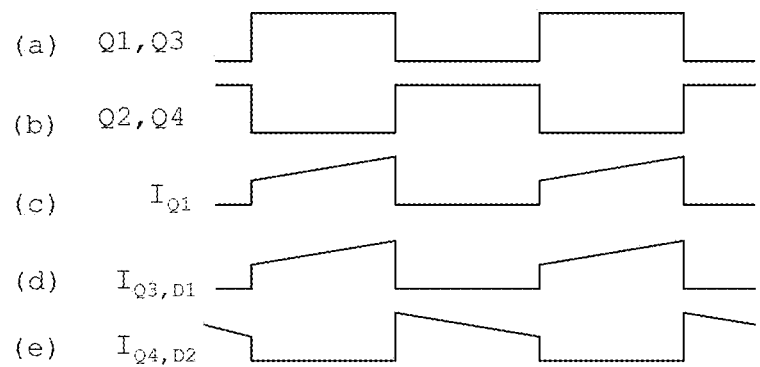
FIG. 4B shows timing diagrams illustrating the operation of switches and current flows in the circuit of FIG. 4A during operation.

The steady state operation of the SMPS 400 of the present embodiment is illustrated in FIG. 4B. During the forward phase of operation, Q1 and Q3 are turned ON and Q2 and Q4 are turned OFF (as shown traces (a) and (b) in FIG. 4B) so that current from the input voltage source flows through Q1 and the primary winding 410-1 (trace (c)) to induce a voltage (scaled by the turns ratio N) and simultaneous current flow through Q3, the secondary winding 410-2, the forward-biased diode D1 and inductor L1 on the secondary side (trace (d) in FIG. 4B). Energy is thus transferred from the primary side to the secondary side of the transformer 410, similar to the case of a forward converter. Part of the transferred energy is stored in the magnetic field of L1.

During the second ("fly-back") phase of operation, Q1 and Q3 are turned OFF, and Q2 and Q4 are turned ON, and the active clamp circuit resets the magnetisation of the transformer core 410-3. Meanwhile, on the secondary side, since Q4 is turned ON, the fly-back energy stored in the magnetic field of the transformer 410 during the fly-back phase of operation is released into the secondary side circuit to provide a current to the converter's load, via terminals T1, T2 and (forward biased) diode D2. During the fly-back phase, the SMPS 400 thus behaves similarly to a fly-back converter. It is noted that the current takes the same path through the secondary winding 410-2 in the forward and fly-back phases of operation but flows along this path in opposite directions in the forward and fly-back phases of operation. Capacitor C2 is also charged during the fly-back phase of operation.

It will be appreciated from the foregoing description that, regardless of SMPS input voltage $V_{in}$, the same transformer winding will be active at secondary side. It may be utilised 100% of the time to continuously transfer power, so that power is either transferred directly from the primary side, or from the stored magnetic field in the transformer core 410-3. However, when $V_{in}$ increases, the duty cycle will tend to shorten, meaning that the secondary winding 410-2 will not be utilised 100% of the time, and that the current in the primary side is constant.

Figure 3B:
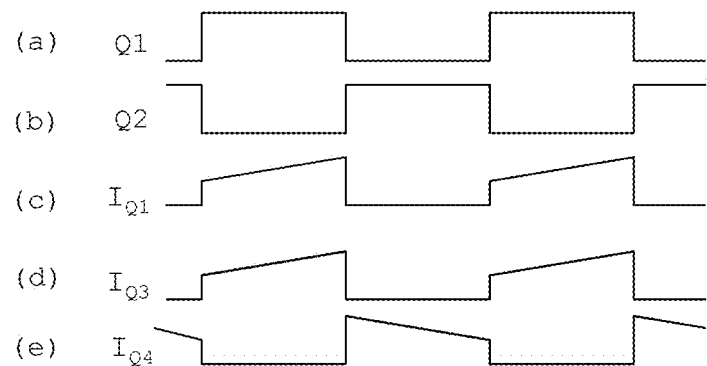
FIG. 3B shows timing diagrams illustrating the operation of switches and current flows in the circuit of FIG. 3A during operation.

When Vin increases, the ON time of Q1 will be shorter, leading to lower resistive losses but higher switching losses and capacitive losses. In practice, these effects tend to cancel each other out rather effectively; this is one of the reasons why the SMPS of the present embodiment is able to operate efficiently over a wide input voltage range. The SMPS of FIG. 3, with two secondary side windings, has a clearer "sweet spot" in efficiency at around 50% duty-cycle. The present embodiment thus provides an important step towards to the ultimate design where input voltage does not affect efficiency. In many SMPS designs, efficiency decreases significantly with increasing input voltage Vin.

It will also be appreciated that the present embodiment represents a significant simplification of the fly-forward converter illustrated in FIG. 3A, as it uses one (power) winding for two non-symmetrical signals. The converter of FIG. 3A, on the other hand, uses two windings and separates the power with switch elements. In other words, in the present embodiment, a single winding serves two purposes, namely to transfer power during both the forward and fly-back phases of operation.

Figure 5:
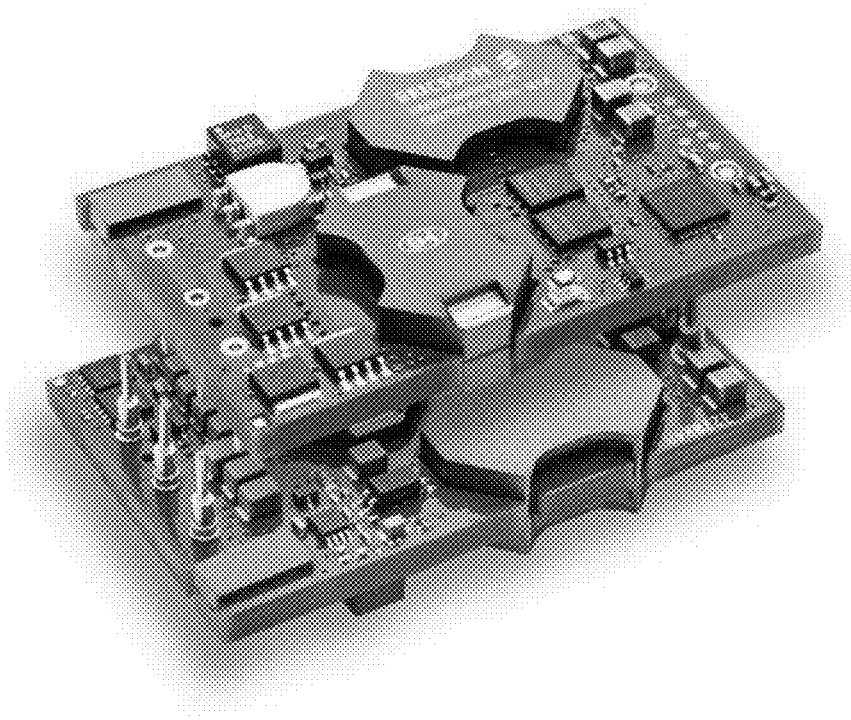
FIG. 5 shows an example of an SMPS manufactured by Ericsson AB™.

In many cases, it is not easy to make a good transformer design when the number of turns increases. Keeping down the number of turns can make impossible designs possible, and this is especially true for planar transformers of the kind used in Ericsson's SMPS product illustrated in FIG. 5.

The full-wave rectifier networks often used in switched mode power supplies generally use a dedicated OFF time, where all switches are opened to allow current to circulate around the transformer during the so-called "free-wheeling" phase. Fly-forward converters do not have a dedicated OFF-time as they toggle back and forth between fly-back and forward modes of operation. In the embodiment, the four rectifiers in the rectification circuit do not all conduct current at the same time, except during a short handshake time. This makes the drive signals that are applied to the synchronous rectifiers, and the current that flows through the rectifiers, different from the conventional full-wave rectifier for bridge designs.

It should also be noted that the fly-forward topology is compatible with so-called "self-driven" FETs. More specifically, is may be possible to take control signals from the transformer directly to control the switching of the synchronous rectifiers Q3 and Q4. In other words, the secondary winding 410-2 may serve as a control signal generator to generate control signals to drive the synchronous rectifiers in the required manner. Hard-switching topologies, such as the forward topology, do not allow this to be done in such a simple, cost-effective way.

Figure 6:
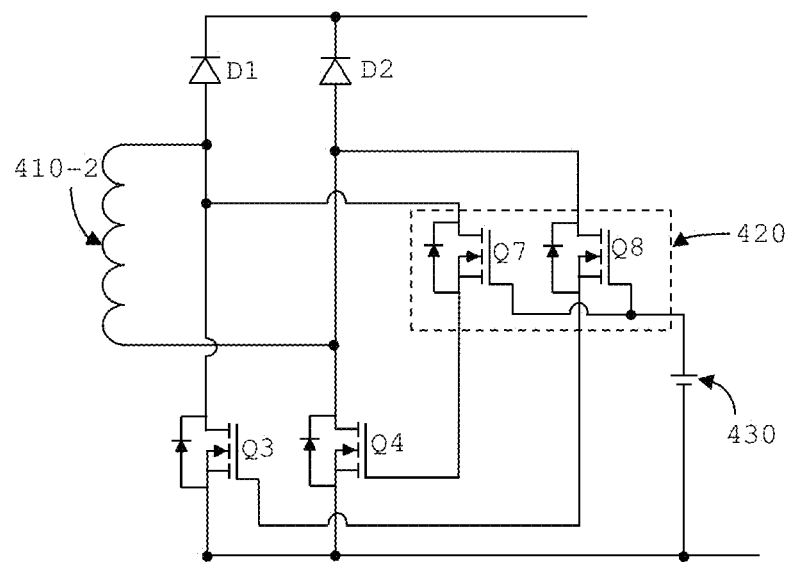
FIG. 6 shows an example of a drive circuit for controlling synchronous rectifiers Q3 and Q4 in FIG. 4A, in an embodiment where these rectifiers are provided in the exemplary form of N-channel MOSFETs.

An example of how the switching of Q3 and Q4 may be controlled by the secondary winding 410-2 will now be described with reference to FIG. 6. FIG. 6 shows a portion of the secondary side circuit of FIG. 4A, including the secondary winding 410-2, diodes D1 and D2, and rectifiers Q3 and Q4 in the form of N-channel MOSFETs, each of which is controlled to switch ON and OFF by a control signal generated by the secondary winding 410-2. As shown in FIG. 6, signals from the secondary winding 410-2 (specifically, from terminals T1 and T2 in the present example) are conveyed to the gates of Q3 and Q4 via a voltage limiter 420 comprising FETs Q7 and Q8, whose gates are connected to a DC voltage source 430 that supplies a DC voltage of 6-10 V, for example.

Embodiment 2

A switched mode power supply according to a second embodiment of the present invention will now be described with reference to FIGS. 7A and 7B.

Figure 7A:
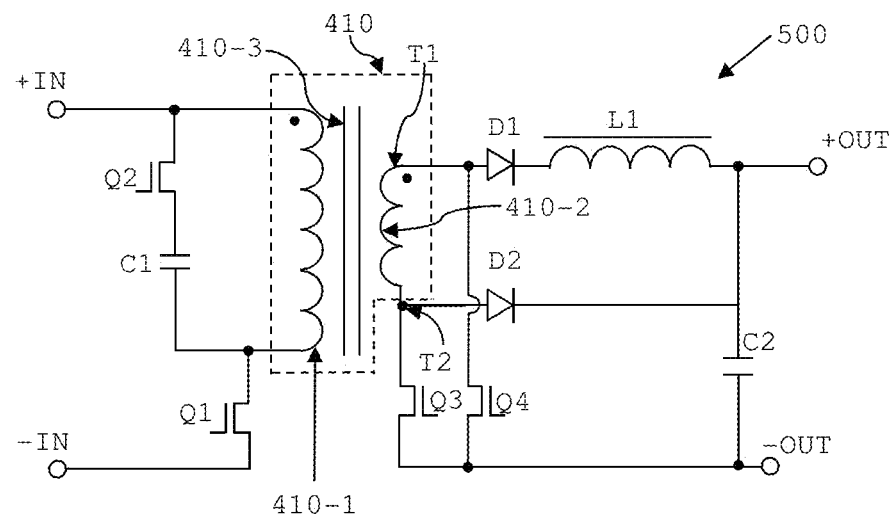
FIG. 7A shows the circuit layout of an SMPS according to a second embodiment of the invention.
Figure 7B:
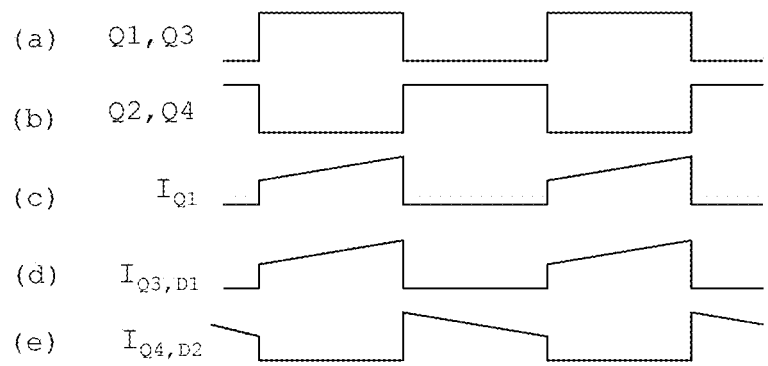
FIG. 7B shows timing diagrams illustrating the operation of switches and current flows in the circuit of FIG. 7A during operation.

The SMPS 500 shown in FIG. 7A differs from the SMPS 400 of the first embodiment only in that the cathodes of diodes D1 and D2 are connected to opposite ends of the inductor L1. Thus, in contrast to the SMPS 400 of FIG. 4A, the cathode of diode D2 is connected to the output terminal +OUT of the SMPS 500, rather than being connected to +OUT indirectly through the inductor L1. In this alternative embodiment, power will be delivered to the output of the SMPS through Q4 and D2 (while by-passing the choke L1) in the fly-back phase, and via the choke L1 in the forward phase. Routing the current in the secondary side to by-pass the choke L1 may provide the advantage of reducing losses in the fly-back phase.

The switched mode power supplies of the first and second embodiments are otherwise the same, and the overlapping descriptions will be omitted for sake of brevity. Apart from the aforementioned differences, the SMPS 500 of the second embodiment operates in the same way as the first embodiment, as illustrated in traces (a) to (e) in FIG. 7B.

Embodiment 3

A switched mode power supply according to a third embodiment of the present invention will now be described with reference to FIGS. 8A and 8B.

Figure 8A:
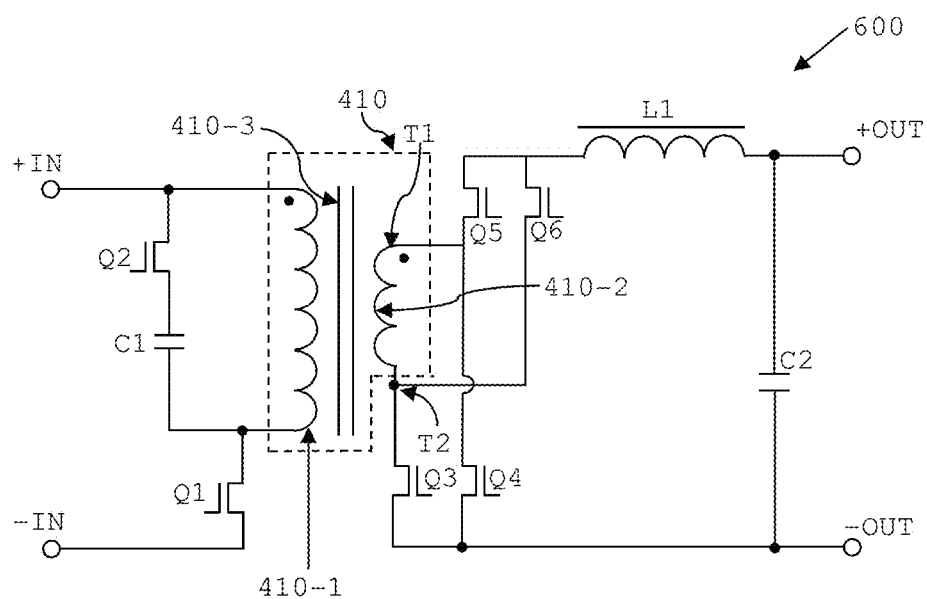
FIG. 8A shows the circuit layout of an SMPS according to a third embodiment of the invention.

The SMPS 600 shown in FIG. 8A differs from the SMPS 400 of the first embodiment only in that the high-side rectifiers on the secondary side are provided in the form of synchronous rectifiers Q5 and Q6, instead of the passive rectifiers (namely, diodes D1 and D2) of the SMPS 400. The switched mode power supplies of the first and third embodiments are otherwise the same, and the overlapping descriptions will be omitted for sake of brevity.

Figure 8B:
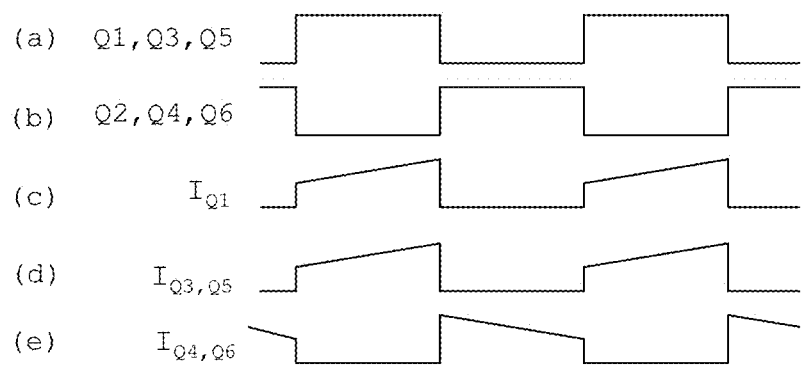
FIG. 8B shows timing diagrams illustrating the operation of switches and current flows in the circuit of FIG. 8A during operation.

Apart from the aforementioned fully synchronous rectification provided on the secondary side, the SMPS 600 of the third embodiment operates in the same way as the first embodiment, as illustrated in traces (a) to (e) in FIG. 8B. More specifically, a control signal generator (not shown) may be provided, on either the primary side or secondary side of the transformer 410, to generate control signals to switch Q1 to Q6 between high and low states (or ON and OFF), as shown in traces (a) and (b) of FIG. 8B, so that Q5 and Q6 behave as rectifiers having the same polarity as diodes D1 and D2 of SMPS 400.

The high-side rectifiers Q5 and Q6 may be provided in the form of N-channel or P-channel FETs, for example. In the present embodiment, Q5 and Q6 are provided in the form of N-channel FETs (e.g. N-channel MOSFETs), whose switching is controlled by the control signal generator. Although N-channel FETs may have superior performance to P-channel devices, they need to be driven by a higher voltage signal, which could be provided by a boot-strap drive circuit, for example. The lower the output voltage is during operation of the SMPS 600, the more advantageous the N-channel solution will be.

Figure 9:
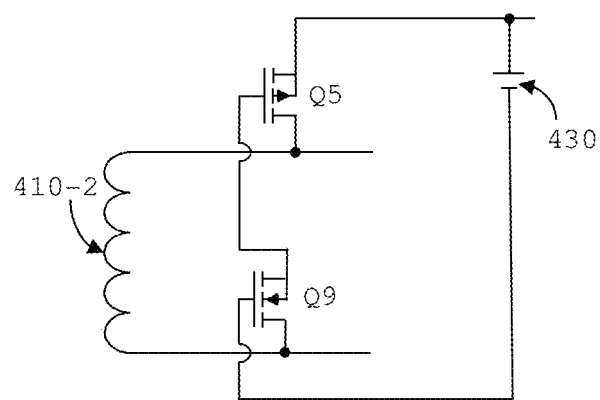
FIG. 9 shows an example of a drive circuit for controlling synchronous rectifier Q5 in FIG. 8A, in an embodiment where Q5 is provided in the exemplary form of a P-channel MOSFET.

Alternatively, P-channel FETs may be used in place of N-channel FETs for Q5 and Q6. P-channel FETs have a roughly 10 times higher value of Rds(ON) than N-channel FETs. However, since the drive signal is negative, they can be self-driven by the secondary transformer winding 410-2. The implementation can be very simple, for example as shown in FIG. 9. More specifically, FIG. 9 shows an example of a drive circuit for controlling Q5 in FIG. 8A, in the case where Q5 is provided in the form of a P-channel MOSFET. The gate of Q5 is connected to the secondary side winding 410-2 (e.g. at terminal T2) via the channel of N-channel MOSFET Q9. The gate of Q9 is connected to DC voltage source 430, which may provide a DC voltage of e.g. −6 to −10 V in relation to the drain terminal of Q5. Transistor Q6 could be made self-driven in a similar way to Q5.

At low loads, when the high Rds(ON) is not critical, a significant boost in performance can be achieved. When the load is high, the integrated body-drain diode will take over. The body drain diode is often not "best in class" but it may provide a good trade-off.

Embodiment 4

A switched mode power supply according to a fourth embodiment of the present invention will now be described with reference to FIGS. 10A and 10B.

Figure 10A:
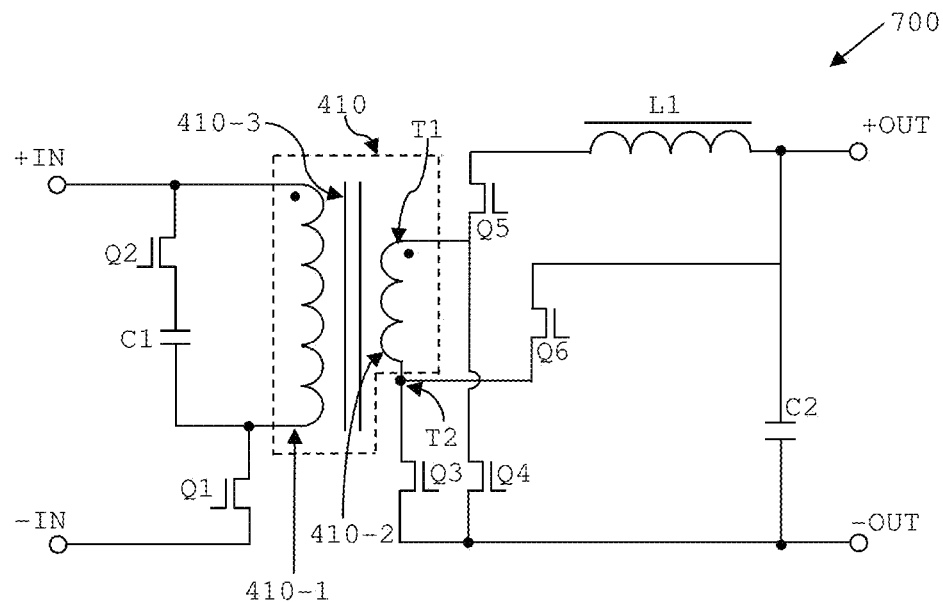
FIG. 10A shows the circuit layout of an SMPS according to a fourth embodiment of the invention.
Figure 10B:
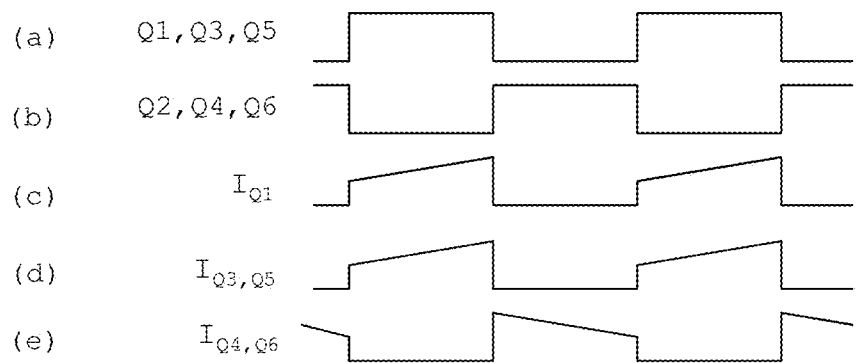
FIG. 10B shows timing diagrams illustrating the operation of switches and current flows in the circuit of FIG. 10A during operation.

The SMPS 700 shown in FIG. 10A differs from the SMPS 600 of the third embodiment only in that the high-side FETs Q5 and Q6 are connected to opposite ends of the inductor L1. Thus, in contrast to the SMPS 600 of FIG. 8A, Q6 is connected to the output terminal +OUT of the SMPS 700 rather than being connected to the +OUT terminal indirectly through the inductor L1. In this alternative embodiment, power will be delivered to the output of the SMPS through Q4 and Q6 (while by-passing the choke L1) in the fly-back phase, and via the choke L1 in the forward phase. Routing the current in the secondary side to by-pass the choke L1 may provide the advantage of reducing losses in the fly-back phase.

The switched mode power supplies of the third and fourth embodiments are otherwise the same, and the overlapping descriptions will be omitted for sake of brevity. Apart from the aforementioned differences, the SMPS 700 of the fourth embodiment operates in the same way as the third embodiment, as illustrated in traces (a) to (e) in FIG. 10B.

[Modifications and Variations]

Many modifications and variations can be made to the embodiments described above.

For example, in the above embodiments, a semi-synchronous or fully-synchronous rectification circuit is provided on the secondary side of the isolating transformer. However, in other embodiments, each of the rectifiers in the rectification circuit may take the form of a passive rectifying device such as a diode. For example, in the first embodiment, Q3 and Q4 could be replaced with diodes whose anodes are connected to the −OUT terminal of the SMPS, and whose cathodes are respectively connected to terminals T1 and T2 of the secondary transformer winding. A fully passive rectification circuit of this kind may provide higher efficiency at low SMPS load levels, but may exhibit an inferior low-load transient response than the fully-synchronous rectification circuits of the third and fourth embodiments.

Figure 11:
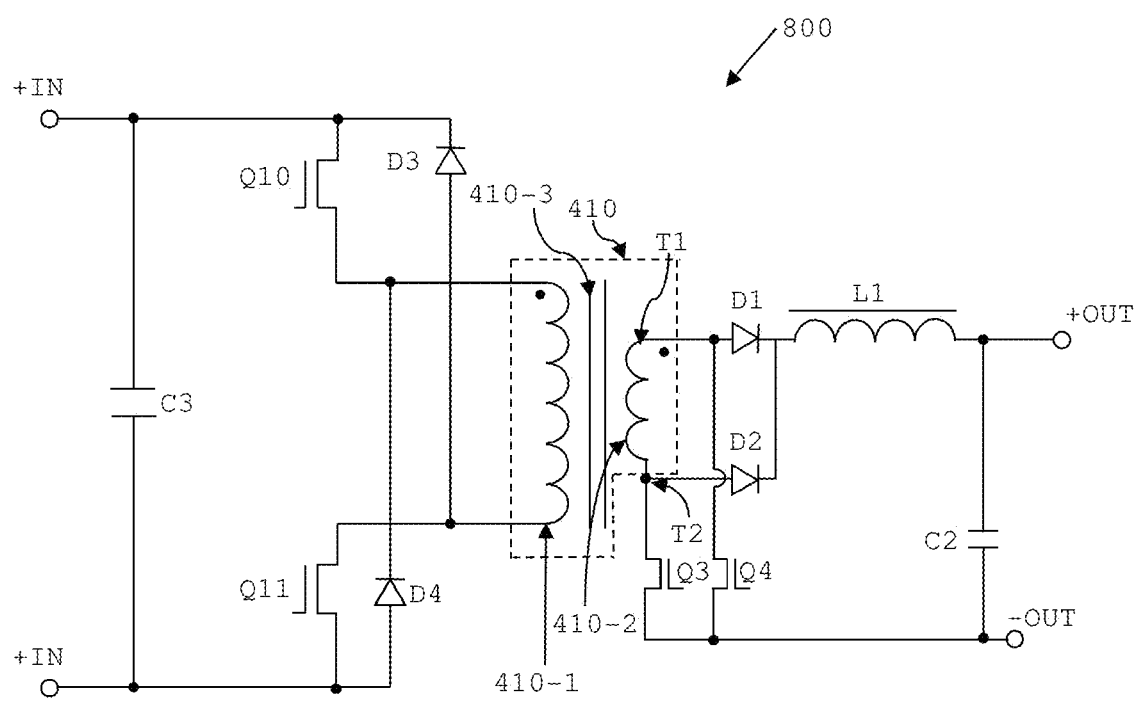
FIG. 11 shows a variant of the SMPS of the first embodiment, which has a modified primary side circuit.

Furthermore, the primary side circuit of the SMPS of the above embodiments is not limited to the example shown but may be provided in a different form, for example as shown in FIG. 11. FIG. 11 shows a variant of the above-described first embodiment, comprising a primary side circuit in which transistors Q10 and Q11 are connected to opposite ends of the primary winding 410-1 and to respective input terminals +IN and −IN of the SMPS 800, in parallel with input capacitor C3. The primary side circuit further comprises diodes D3 and D4, which are connected to the input terminals +IN and −IN and to the ends of the primary winding 410-1 as shown in FIG. 11. During the forward phase of operation, Q10 and Q11 turn ON to allow current to pass through the primary winding 410-1, while diodes D3 and D4 remain reverse-biased and do not conduct. In the fly-back phase, on the other hand, Q10 and Q11 are turned OFF while D3 and D3 allow current to flow through the primary winding 410-1, thereby resetting the transformer core 410-3. In other respects, the SMPS 800 operates in the same way as the SMPS 400 of the first embodiment, which has been described in detail above. It should be noted that the primary side circuit of the present variant is equally applicable to the remaining embodiments set out above.

The invention claimed is:

1. A switched mode power supply, comprising:
    a transformer comprising a primary winding, a transformer core configured to store energy transferred thereto from the primary winding during operation, and a single, non-tapped secondary winding having a first terminal and a second terminal;
    a primary side circuit arranged to generate voltage pulses and thereby to drive the primary winding of the transformer; and
    a secondary side circuit comprising a rectification circuit connected to the secondary winding at the first and second terminals, wherein the rectification circuit is semi-synchronous, comprises one or more transistors and one or more diodes, and is arranged such that:
        during a forward phase of operation of the switched mode power supply, in which the primary winding is driven by the primary side circuit to magnetize, and store energy in, the transformer core, a current induced to flow in the secondary winding from the second terminal to the first terminal is output by the rectification circuit; and
        during a fly-back phase of operation of the switched mode power supply, in which the magnetization of the transformer core is reset, a current induced to flow in the secondary winding from the first terminal to the second terminal of the secondary winding is output by the rectification circuit so that energy stored in the transformer during the forward phase of operation is output by the rectification circuit; and
    wherein the secondary side circuit further comprises a voltage limiter circuit configured to provide signals from the secondary winding to one or more gate terminals of the one or more transistors.

2. A switched mode power supply according to claim 1, wherein the rectification circuit comprises:
    a first rectifier and a second rectifier connected to the first and second terminals of the secondary winding, respectively, the first and second rectifiers being further connected to a first output terminal of the switched mode power supply; and
    a third rectifier and a fourth rectifier connected to the first and second terminals of the secondary winding, respectively, the third and fourth rectifiers being further connected to a second output terminal of the switched mode power supply,
    wherein the polarities of said rectifiers are arranged such that, during the forward phase of operation of the switched mode power supply, the current induced to flow in the secondary winding from the second terminal to the first terminal is output by the rectification circuit and, during the fly-back phase of operation of the switched mode power supply, the current induced to flow in the secondary winding from the first terminal to the second terminal of the secondary winding is output by the rectification circuit.

3. A switched mode power supply according to claim 2, wherein the secondary side circuit further comprises an inductor connected to the rectification circuit and an output terminal of the switched mode power supply.

4. A switched mode power supply according to claim 3, wherein a first end of the inductor is connected to both the third and fourth rectifiers, and a second end of the inductor is connected to the second output terminal of the switched mode power supply.

5. A switched mode power supply according to claim 3, wherein a first end of the inductor is connected to the third rectifier, and a second end of the inductor is connected to both the fourth rectifier and the second output terminal of the switched mode power supply.

6. A switched mode power supply according to claim 2, wherein:
   each of the first and second rectifier is a synchronous rectifier;
   each of the third and fourth rectifier is a diode;
   the switched mode power supply comprises a control signal generator arranged to generate control signals to control switching of the first and second synchronous rectifiers; and
   the polarities of the diodes in the rectification circuit and the control signals which the control signal generator is arranged to generate are such that, during the forward phase of operation of the switched mode power supply, the current induced to flow in the secondary winding from the second terminal to the first terminal is output by the rectification circuit and, during the fly-back phase of operation of the switched mode power supply, the current induced to flow in the secondary winding from the first terminal to the second terminal of the secondary winding is output by the rectification circuit.

7. A switched mode power supply according to claim 6, wherein the control signal generator comprises at least a portion of the secondary winding.

8. A switched mode power supply according to claim 2, wherein:
   each of the rectifiers is a synchronous rectifier; and
   the switched mode power supply further comprises a control signal generator arranged to generate control signal to control switching of the synchronous rectifiers such that, during the forward phase of operation of the switched mode power supply, the current induced to flow in the secondary winding from the second terminal to the first terminal is output by the rectification circuit and, during the fly-back phase of operation of the switched mode power supply, the current induced to flow in the secondary winding from the first terminal to the second terminal of the secondary winding is output by the rectification circuit.

* * * * *